US008159240B2

(12) United States Patent
McLean et al.

(10) Patent No.: US 8,159,240 B2
(45) Date of Patent: Apr. 17, 2012

(54) BULK CURRENT INJECTION (BCI) PROBE WITH MULTIPLE, SYMMETRICALLY SPACED FEEDS

(75) Inventors: James S. McLean, Austin, TX (US); Robert A. Sutton, Austin, TX (US)

(73) Assignee: TDK Corporation, Chiba (JP)

( * ) Notice: Subject to any disclaimer, the term of this patent is extended or adjusted under 35 U.S.C. 154(b) by 463 days.

(21) Appl. No.: 12/351,044

(22) Filed: Jan. 9, 2009

(65) Prior Publication Data
US 2010/0176817 A1    Jul. 15, 2010

(51) Int. Cl.
*G01R 29/20*    (2006.01)
(52) U.S. Cl. .......................... 324/726; 324/127; 336/180
(58) Field of Classification Search .................... 324/726
See application file for complete search history.

(56) References Cited

U.S. PATENT DOCUMENTS

| | | | | |
|---|---|---|---|---|
| 4,413,230 | A * | 11/1983 | Miller | 324/142 |
| 4,415,850 | A * | 11/1983 | Sherwood | 324/509 |
| 4,591,942 | A * | 5/1986 | Willard et al. | 361/97 |
| 4,616,174 | A * | 10/1986 | Jorgensen | 324/117 R |
| 4,629,979 | A * | 12/1986 | Missout et al. | 324/126 |
| 4,674,481 | A * | 6/1987 | Boddie et al. | 600/10 |
| 4,901,010 | A * | 2/1990 | Bernard | 324/127 |
| 5,053,716 | A | 10/1991 | Hansen et al. | |
| 5,218,307 | A * | 6/1993 | Hiller | 324/541 |
| 5,397,980 | A | 3/1995 | Blose et al. | |
| 6,121,779 | A * | 9/2000 | Schutten et al. | 324/627 |
| 6,242,925 | B1 | 6/2001 | Schutten et al. | 324/627 |
| 6,538,863 | B1 * | 3/2003 | Macbeth | 361/42 |
| 6,784,770 | B2 * | 8/2004 | Gimenez et al. | 335/18 |
| 2002/0153954 | A1* | 10/2002 | Hochschild | 330/258 |
| 2009/0115403 | A1* | 5/2009 | Bernklau | 324/127 |
| 2010/0033165 | A1* | 2/2010 | Rostamzadeh et al. | 324/127 |
| 2010/0148907 | A1* | 6/2010 | Younsi et al. | 336/180 |

FOREIGN PATENT DOCUMENTS
SU    838769 B  *   6/1981

OTHER PUBLICATIONS

Trout, Dawn H., "Investigation of the Bulk Current Injection Technique by Comparison to Induced Currents from Radiated Electromagnetic Fields", Symposium Record, 1996 IEEE International Symposium on Electromagnetic Compatibility, Aug. 19, 1996, pp. 413-417 (separate IEEE abstract included with article).* McLean et al., "The Excitation of Balanced Transmission Line Modes in Bulk Current Injection Measurements," International Zurich Symposium on Electromagnetic Compatibility, Jan. 12, 2009, pp. 421-424.

* cited by examiner

*Primary Examiner* — Timothy J Dole
*Assistant Examiner* — Benjamin M Baldridge
(74) *Attorney, Agent, or Firm* — Kevin L. Daffer; Daffer McDaniel, LLP

(57) ABSTRACT

A Bulk Current Injection (BCI) transformer is provided herein with a magnetic core and a plurality of windings. The magnetic core is configured for encircling one or more electrical conductors under test. Each of the plurality of windings are wrapped, at least in part, around a longitudinal dimension of the magnetic core and spaced apart around an azimuthal dimension of the magnetic core. During injection tests, a power source may be coupled for supplying current to each of the windings at a respective "feed point." Arranging multiple feed points around the magnetic core enables current flow through the windings to generate an azimuthally-uniform magnetic flux density in the magnetic core. The uniform magnetic flux density enables the BCI transformer to excite only common mode currents in the electrical conductors under test. BCI test methods, including injection tests and current sensing tests are also provided herein, along with a test setup for characterizing BCI transformers.

30 Claims, 8 Drawing Sheets

Two windings
spaced 180 degrees apart

Four windings
spaced 180 degrees apart

BULK CURRENT INJECTION (BCI) PROBE WITH MULTIPLE, SYMMETRICALLY SPACED FEEDS

BACKGROUND OF THE INVENTION

1. Field of the Invention

This invention relates to Bulk Current Injection (BCI) transformers and, more particularly, to BCI transformers with improved magnetic field uniformity, bandwidth and power handling.

2. Description of the Related Art

The following descriptions and examples are given as background only.

Bulk Current Injection (BCI) immunity test methods are often used to evaluate the electromagnetic susceptibility of a wide range of electronic devices. The BCI method injects continuous wave or pulsed current onto the electrical conductor(s) of a device under test (DUT) to mimic the excitation of common mode current on the conductors by far field (plane wave) electromagnetic radiation. BCI tests are desirable because, over a given frequency range, they typically require much less power to produce a specified common mode current on a conductor than a radiated immunity test.

BCI tests use "flux coupled" or Faraday transformers, called BCI probes, to inject large RF currents onto one or more conductors of an electronic device. A typical BCI probe 100 is depicted in FIG. 1. As shown in FIG. 1, BCI probe 100 includes a magnetic core 110, which encircles the conductor(s) 120 onto which common mode current is to be excited. A single magnetic coil 130, comprising one or more turns, is wrapped around the magnetic core at the input or "feed point" of the transformer.

In injection mode, magnetic coil 130 acts as a primary winding and conductors 120 of the DUT act as a secondary winding. RF power source 140 is connected to the primary winding. Current flow in the primary winding (the "primary current") generates a magnetic flux in the core, which in turn, induces current to flow in the secondary winding via electromagnetic coupling. In addition to current injection, BCI transformers may be used to sense and measure common mode current on conductors 120. In sensing mode, conductors 120 act as the primary winding, and coil 130 wound around core 110 acts as the secondary winding. The transformer is called a "current monitor" when used to sense common mode current.

Recently, efforts have been made to characterize BCI transformers over broader frequency ranges as BCI tests are extended to increasingly higher frequencies. However, little published work exists concerning the electromagnetic fields produced by such devices. There is also little published work concerning the distributed or retarded electromagnetic effects (sometimes referred to as dimensional effects) within the magnetic cores of these transformers, or how these effects manifest themselves in the injected or sensed current. The present invention alleviates this oversight by providing a test fixture for characterizing the distributed effects produced within the magnetic cores of BCI transformers. Exemplary solutions are also provided herein for overcoming such effects.

SUMMARY OF THE INVENTION

The following description of various embodiments of a test setup for characterizing a Bulk Current Injection (BCI) transformer, a BCI transformer and a BCI test method is not to be construed in any way as limiting the subject matter of the appended claims.

According to one embodiment, a test setup is provided herein for characterizing a BCI transformer. In general, the test setup may include a plurality of electrical conductors arranged in parallel and separated by a distance. The test setup may also include a dielectric clamp coupled to an external surface of the BCI transformer in order to fix the position of the BCI transformer around the electrical conductors, such that the plurality of electrical conductors extend through the BCI transformer along a longitudinal axis. In one embodiment, the test setup may be used to characterize the non-common mode(s) produced by conventional BCI transformers in the electrical conductors. In some embodiments, the test setup may be configured for characterizing the common mode, as well as the non-common modes.

As described in more detail below, the plurality of electrical conductors may be implemented as a "cable bundle" comprising N-number of conductors and a ground return. During injection mode, power supplied to the plurality of windings generates a magnetic field within the core, which induces current flow within the electrical conductors of the cable bundle. In some embodiments, a BCI transformer under test may induce both common and non-common mode currents in the cable bundle. As used herein, the "common mode" is defined as the mode in which the instantaneous current in all N-conductors is flowing in the same direction (note: current returns through the ground conductor in the opposite direction). A "non-common mode" may be defined herein as the mode in which the instantaneous current does not flow in the same direction in all N-conductors.

Unlike conventional calibration fixtures, which use only one electrical conductor, the test setup described herein may include a "cable bundle" comprising two or more electrical conductors of uniform cross-sectional geometry. For instance, an even number of electrical conductors may be included within the test setup described herein. In one embodiment, the electrical conductors may be separated by a distance, which is chosen so that azimuthally-inhomogeneous magnetic fields produced by a conventional BCI transformer will excite non-common modes in the electrical conductors. The modes excited within the electrical conductors depends on the number of conductors used and the distance there between. If an even number of electrical conductors are used, the distance may be chosen to facilitate the excitation of differential modes in the electrical conductors. A "differential mode" is defined herein as a mode in which the sum of the current on the conductors, or the net current, is zero. The distance between the electrical conductors is not fixed, however, and may be altered in some embodiments.

An automatic vector network analyzer is included within the test setup for characterizing the non-common modes excited within the electrical conductors by the BCI transformer. In one embodiment, characterization may be performed by measuring insertion loss between an output port of the BCI transformer under test and one of the test setup ports. Rotational means are also provided for rotating the electrical conductors in incremental stages so that incremental insertion loss measurements can be obtained.

In one embodiment, the test setup may include a pair of voltage baluns, each coupled to a different end of the plurality of electrical conductors. In this embodiment, insertion loss measurements may be obtained by coupling a first input port of the automatic vector network analyzer to an output port of the BCI transformer and a second input port of the automatic vector network analyzer to an output port of one of the voltage baluns. The rotational means may be coupled between the output port of the one voltage balun and the second input port of the automatic vector network analyzer for rotating the electrical conductors in incremental stages.

In another embodiment, the test setup may be configured for characterizing the common mode, as well as the non-common modes excited by the BCI transformer. For instance, the test setup may include a pair of 180-degree hybrid networks each coupled to a different end of the plurality of electrical conductors, and a pair of coaxial switches each coupled to a pair of sum and difference ports of a respective hybrid network. The coaxial switches may be selectively activated to cause the hybrid networks to receive a common mode signal or a non-common mode signal. The selected signal (i.e., the common mode or non-common mode signal) may be forwarded to the automatic vector network analyzer for measuring insertion loss. In one embodiment, insertion loss measurements may be obtained by coupling a first input port of the automatic vector network analyzer to an output port of the BCI transformer and a second input port of the automatic vector network analyzer to an output port of one of the coaxial switches. The rotational means may be coupled between the output port of the one coaxial switch and the second input port of the automatic vector network analyzer for rotating the electrical conductors in incremental stages.

An improved BCI transformer is also provided herein. In general, the improved BCI transformer may include a magnetic core configured for encircling one or more electrical conductors under test. The magnetic core may comprise a ferrite material. The magnetic core may comprise substantially any geometry which provides a closed magnetic circuit. In one embodiment, for example, the magnetic core may have a substantially cylindrical shape. In another embodiment, the magnetic core may comprise one or more toroids arranged in a stack. In some cases, the magnetic core may be split in two halves, enabling the core to clamp around the electrical conductors.

Unlike conventional transformers, the improved BCI transformer described herein includes a plurality of windings each wrapped, at least in part, around a longitudinal dimension of the magnetic core and spaced apart around an azimuthal dimension of the magnetic core. A uniform magnetic flux density may be generated when the plurality of windings are spaced somewhat symmetrically around the core. In one embodiment, the plurality of windings may comprise two windings spaced approximately 180° apart around the azimuthal dimension of the magnetic core. In another embodiment, the plurality of windings may comprise three windings spaced approximately 120° apart, or four windings spaced approximately 90° apart, around the azimuthal dimension of the magnetic core. Although a strictly symmetric arrangement may provide optimum results, the invention is not so limited and may generally include two or more windings, which are spaced apart from one another and distributed around the azimuthal dimension of the core.

In some cases, the windings may each be implemented with one or more turns of an electrical conductor. In other cases, an electrostatic shield may be included for encasing the magnetic core and the plurality of windings. In such cases, each of the plurality of windings may comprise a half-turn of an electrical conductor. One end of each half-turn may be connected to the electrostatic shield, and another end of each half-turn may be connected to a feed line connecting the transformer to a power source. The portion of the electrostatic shield between the half-turn winding and the feed line provides another "half turn" to complete the single turn winding.

In some embodiments, a power source may be coupled to the plurality of windings for injecting current onto each of the windings. The point at which current is supplied is referred to as the "feed point." An impedance transforming network may be coupled, in some embodiments, between the power source and the plurality of windings. In one embodiment, the impedance transforming network may comprise an in-phase power divider. In another embodiment, the impedance transforming network may comprise a series-series balun arrangement. In yet another embodiment, the impedance transforming network may comprise a parallel connection between the plurality of windings. Arranging multiple feed points around the magnetic core enables current flow through the windings to generate an azimuthally uniform magnetic flux density in the magnetic core. The uniform magnetic flux density enables the improved BCI transformer described herein to excite only common mode currents in the electrical conductors under test.

A BCI test method is also contemplated herein. In one embodiment, the BCI test method may begin by arranging a BCI transformer around one or more electrical conductors under test. The BCI transformer may be similar to the improved design described above. For instance, the BCI transformer may comprise a magnetic core configured for encircling the electrical conductors under test, and a plurality of windings each wrapped, at least in part, around a longitudinal dimension of the magnetic core. As noted above, the plurality of windings may be symmetrically-spaced around an azimuthal dimension of the magnetic core.

The BCI transformer described herein may be operated in injection and sensing modes. During injection mode tests, equal amounts of power (current or voltage) may be supplied to each of the feed points to generate an electromagnetic field within the magnetic core which induces common mode current flow within the electrical conductors under test. In some embodiments, the step of supplying equal amounts of power to each of the feed points may be performed by coupling an impedance balancing network between a power source and each of the feed points. As noted above, the impedance balancing network may be selected from a group comprising an in-phase power divider, a series-series balun arrangement and a parallel connection arrangement.

During sensing mode, the BCI transformer acts as a passive current monitor. Once the BCI transformer is positioned around the electrical conductors, existing current flowing through the conductors induces a magnetic field within the core, which causes current to flow through the windings. In some embodiments, common mode current flowing on the electrical conductors under test can be measured by sensing and combining output signals received from each of the plurality of windings. The output signals may be selected from a group comprising current, voltage and power. The output signals may be sensed by any conventional means.

BRIEF DESCRIPTION OF THE DRAWINGS

Other objects and advantages of the invention will become apparent upon reading the following detailed description and upon reference to the accompanying drawings in which.

Figure 1:
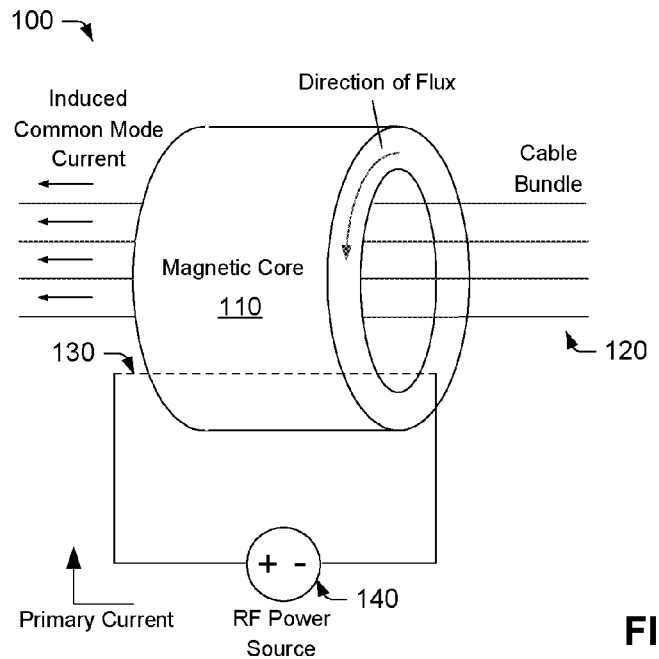
FIG. 1 is a schematic drawing depicting a conventional Bulk Current Injection (BCI) transformer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

BCI transformers typically include a magnetic core, which encircles one or more conductors under test, and a magnetic coil, which is wrapped around the core. An RF power source is coupled to the magnetic coil for supplying power to the input or "feed point" of the transformer. When power is supplied, the current flowing through the magnetic coil (the "primary winding") generates a magnetic flux in an azimuthal direction around the core, which in turn, induces current flow in the conductors under test (the "secondary winding").

Figure 2:
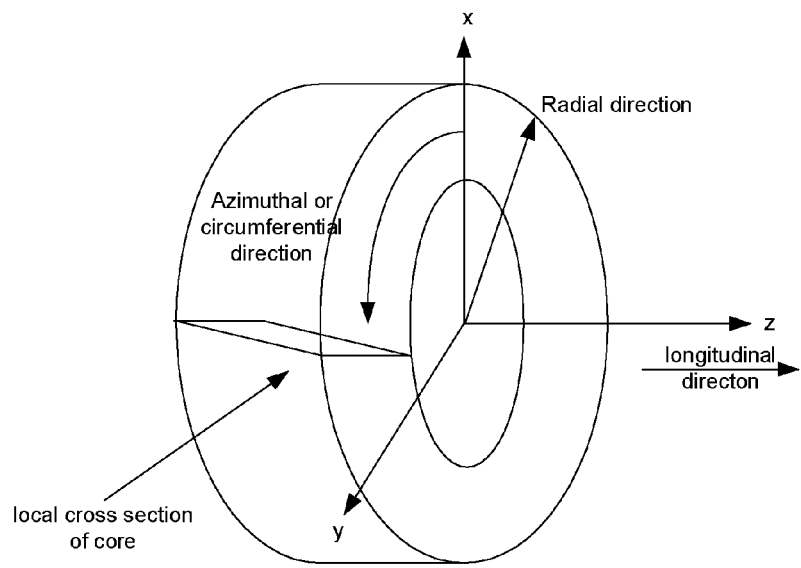
FIG. 2 is a schematic drawing defining a coordinate system for use in describing the electromagnetic behavior of BCI transformers.

The magnetic core may comprise substantially any geometry which provides a closed magnetic circuit. As shown in FIG. 2, the magnetic core is often implemented as a cylinder or toroid with a relatively short axial length (compared to its circumferential dimension). In one example, the core may have an outer diameter of about 127 mm, a thickness of about 70 mm and a center hole of about 40 mm (to accommodate the conductors under test). Some transformers use a composite core made from a stack of "toroids," each having a nominally rectangular local cross section. Because the induced magnetic flux is oriented in the azimuthal direction, stacking of the cores does not result in air gap problems. That is, the effective cross sectional area of the composite core is essentially the sum of the cross sections of the individual cores, regardless of whether extremely tight tolerances are maintained between the cores. The dimensions of a composite core vary with design. However, a representative composite core comprised of four stacked toroids may have an inner diameter of about 50 mm, an outer diameter of about 100 mm and a height of 50 mm. This gives an average diameter of 75 mm and a corresponding peripheral length of about 235 mm. As set forth below, such dimensions tend to elicit dimensional effects in the core.

In most cases, ferrite materials are used in the core to provide sufficiently high coupling between the primary and secondary windings. All ferrite materials exhibit relatively high dielectric permittivity and magnetic permeability. For example, most BCI transformers use nickel-zinc (Ni—Zn) or manganese-zinc (Mn—Zn) ferrites in the core. Nickel-zinc ferrites have relative permittivities of about 10-12, while manganese-zinc ferrites exhibit relative permittivities of several thousand. Nickel-zinc ferrites exhibit relative permeabilities of about 10-1000. Even greater permeabilities are found within Mn—Zn ferrites. The permeabilities and permittivities of the ferrite materials mentioned above are both complex and frequency dependent. Dielectric and magnetic losses are also present in the ferrite materials. However, magnetic losses typically dominate rendering the dielectric losses negligible.

As noted above, the magnetic flux generated in the core is oriented predominantly in the circumferential or azimuthal direction. Because of this orientation, one may expect distributed or retarded electromagnetic effects (sometimes referred to as dimensional effects) to manifest themselves only in the radial or longitudinal directions. However, it is prudent to investigate distributed effects in the azimuthal direction, since even this dimension can be electrically large due to the combination of high permeability and permittivity in the ferrite core. In some cases, the combination of high permeability and permittivity may cause the ferrite core to exhibit distributed behavior at frequencies commonly used in BCI tests.

For example, assume a ferrite core demonstrates a real (lossless) relative permeability of 125 (typical for some Ni—Zn ferrites) and a permittivity of 12 (also typical for some Ni—Zn ferrites). The combined permittivity and permeability would cause the wavelength in the ferrite core to be about $1/40^{th}$ that of free space. When typical core dimensions are considered (e.g., a 50 mm inner diameter and 100 mm outer diameter), distributed effects may become apparent at several hundred MHz (well within the range of typical BCI tests). The situation worsens when magnetic losses are taken into account. As demonstrated below, magnetic losses in the core may cause the magnetic flux density to decay with azimuthal distance from the feed, even though the magnetic field generated in the core is predominantly parallel to the azimuthal direction. This leads to an azimuthal variation in the magnetic flux density in the core, and thus, to an angular variation in the magnetic field of the device.

I. Problem

Conventional BCI probes and current monitors use only one primary winding, and thus, have only one feed point. Most use a single turn loop constructed of copper strap in order to minimize leakage inductance and improve power handling. Some employ several turns of magnet wire. Although the use of multiple turns improves coupling, interwinding capacitance tends to limit high frequency performance. Regardless of the number of turns used, the primary winding typically occupies only a small angular region of the core.

Figure 4:
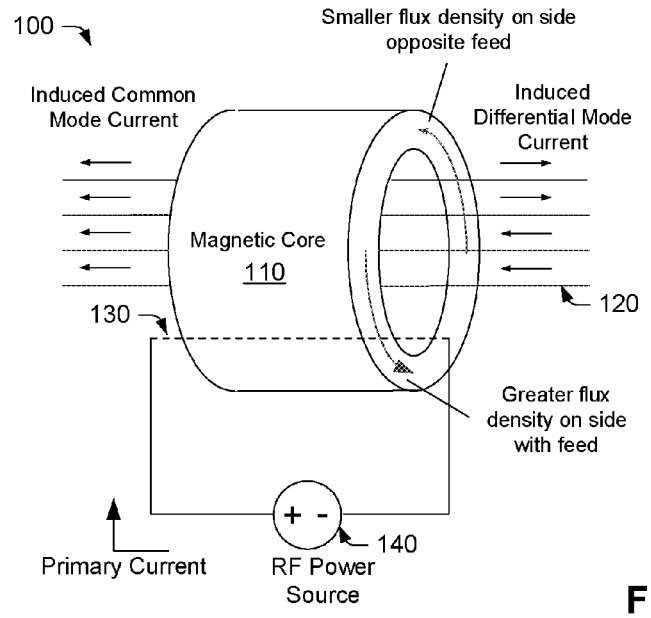
FIG. 4 is a schematic drawing depicting the non-uniform, azimuthally dependent magnetic flux density typically produced within the conventional transformer of FIG. 1 and the differential mode current induced thereby.

The extremely asymmetric nature of the primary winding/feed point, coupled with magnetic losses in the core, results in a non-uniform azimuthally dependent magnetic flux density around the core. The magnetic flux density is generally strong near the primary winding and weaker further away, as shown schematically in FIG. 4. The variation in magnetic flux density tends to excite modes, other than the desired common mode, in the conductors under test. These "other modes" are referred to herein as "non-common modes." The induced current can take on several different forms depending on the number of conductors and their arrangement in the "cable bundle". However, the undesirable induced current is typically a sum of transverse electromagnetic (TEM) modes with zero net current for the bundle. In the case of two conductors (and the external ground return for the bundle), the induced current is in the form of a differential current mode, as shown in FIG. 4.

Inducing non-common modes within the conductors under test is undesirable for many reasons. For example, injecting or coupling to a non-common mode in a conductor or cable bundle is equivalent to driving a non-radiating transmission line mode. Such currents cannot be excited by an incident field consisting of uniform plane waves, and thus, would cause a BCI test and a radiated immunity test to produce dissimilar results. In some situations, such as when the conductors under test are unshielded, the non-common modes induced within the conductor or cable bundle could mimic the modes that transmit desired signals in the system. For at least these reasons, it would be highly beneficial to suppress non-common modes in the conductors under test, so that only the desired common mode is induced.

II. Experimental Test Setup

In principle, a BCI transformer should inject or respond only to common mode current on a cable bundle or multi-conductor transmission line situated over ground. However, other modes can be excited or sensed in the cable bundle when the core exhibits distributed or retarded electromagnetic effects.

Fixtures for testing and calibrating BCI transformers are currently available from many manufacturers (e.g., Fischer Custom Communications and Bergoz). However, these calibration fixtures employ only one conductor upon which the probe may be threaded or clamped (note: the ground return is through a ground plane of the calibration fixture outside the transformer). Thus, currently available calibration fixtures are only capable of injecting or sensing one mode of current (typically, the desired common mode). The inability to sense more than the common mode may have prevented these manufactures from considering the effects of distributed behavior within the core, and how these effects manifest themselves in the injected or sensed current.

Figure 3:
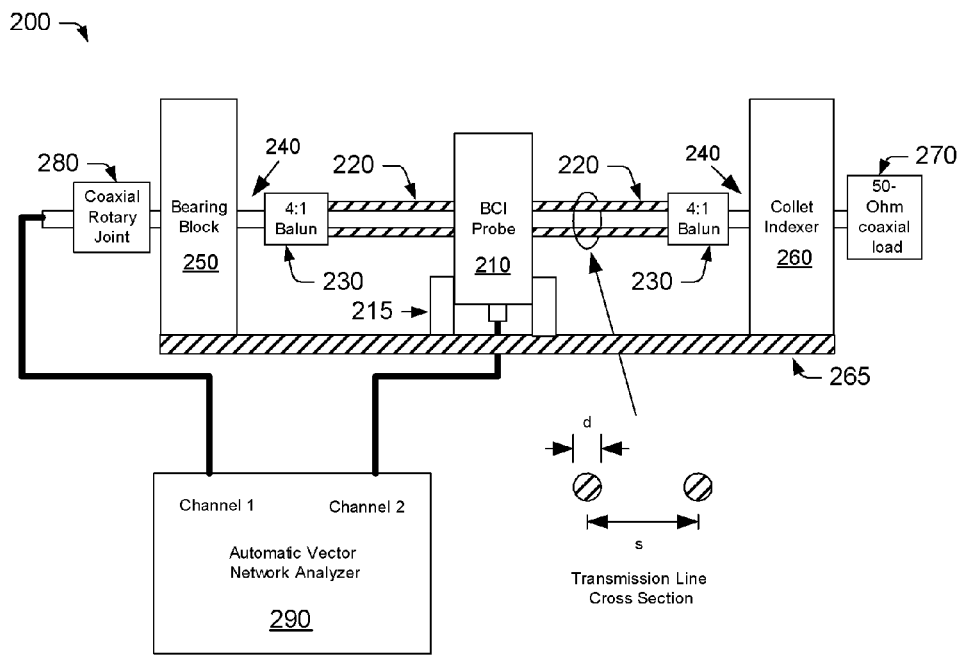
FIG. 3 is a block diagram illustrating one embodiment of a test setup that may be used to characterize the electromagnetic behavior of BCI transformers.

One embodiment of an improved test setup 200 is provided in FIG. 3 for characterizing the differential current modes produced by BCI probe 210 fixtured around a cable bundle or multi-conductor transmission line 220. Experiments were conducted using a conventional probe design similar to probe 100 of FIGS. 1 and 4. Probe 210 is held in place by a dielectric polymer clamp (e.g., a Delrin clamp 215), and thus, is not contained within a conventional calibration fixture. The position of the probe is precisely fixed by the clamp, so that the orientation of transmission line 220 via collet indexer 260 is repeatable.

In the exemplary test setup, the cable bundle is a balanced 200-Ohm transmission line with dimensions chosen to accommodate differential modes. Unlike the common mode, differential mode fields are fairly tightly localized in the region near balanced transmission line 220. A transmission line with sufficiently small cross sectional geometry (d) may not excite the BCI probe and would be essentially immune to fields produced by it. However, coupling can be induced by making the separation (s) between the conductors sufficiently large.

According to one embodiment, a cross sectional geometry of d=4.76 mm and a separation of s=12.7 mm may be used to excite differential mode fields in balanced transmission line 200. With these dimensions, the balanced transmission line has a total width of 17.46 mm and fits easily within the opening of most current probes. The cross sectional geometry (d) is small enough that it is less than $\frac{1}{20}^{th}$ of a wavelength at 1 GHz. This allows some flexibility in the design of the test setup in that voltage baluns 230 shown in FIG. 3 can be designed with a degree of mechanical robustness. For example, the voltage baluns may be mounted in low-permittivity thermoplastic housings configured to rigidly fix the location of the two transmission line conductors. The conductors themselves may be of a beryllium-copper alloy, and thus, may be somewhat resistant to bending.

Although described in the context of a balanced 200-Ohm transmission line 220, the test setup shown in FIG. 3 can be adapted to rotate any uniform two-wire or multi-wire line geometry. Lines having different characteristic impedances (e.g., other than 200 Ohms) can be used by varying the separation (s) between the conductors. In one embodiment, a dielectric stage (not shown) may be incorporated into the test setup for varying the separation (s) between the conductors. The dielectric stage may include a dielectric micrometer screw for varying the separation between the conductors. In one embodiment, the number of conductors and their arrangement in the cable bundle may be modified to accommodate other non-common modes (i.e., other than the differential mode described herein). Although conductors 220 shown in FIG. 3 have a substantially circular cross-section, the conductors are not so limited and may have substantially any uniform cross-sectional geometry.

The test setup shown in FIG. 3 includes two 4:1 impedance transforming baluns 230 on either end of the balanced transmission line 220. Each balun transitions to a 50 Ohm coaxial port. The baluns used in FIG. 3 are of the equal-delay type with a frequency range of 1-1000 MHz. It must be admitted that any balun suffers from non-ideal effects, and thus, exhibits some finite imbalance or common mode rejection ratio (CMRR). However, the particular baluns (MACOM model TP-103) used in the test setup of FIG. 3 are very much electrically small in the frequency range considered here and appear to exhibit very good balance. On the unbalanced, coaxial side of each balun a section of uniform semi-rigid coaxial line 240 extends through a phenolic stem to facilitate mounting of the baluns in either bearing block 250 on the left side, or 5C collet indexer 260 on the right side. In some cases, ferrite choke beads (not shown in FIG. 3) may be strung on the semi-rigid coaxial line 240 to discriminate against common mode current on the shield of the coaxial transmission lines connecting the baluns to the external equipment 250/260. In one embodiment, the base of the test setup comprises rigid aluminum plate 265. The shields of the coaxial ports on the baluns are physically disconnected from the base to further discriminate against common mode propagation.

In the illustrated embodiment, 200-Ohm balanced line 220 is matched on the right side by connecting a matched 50-Ohm coaxial load 270 to the coaxial port of the balun on the right side of FIG. 3. The coaxial port on the left side is connected to port 1 of an automatic vector network analyzer 290, while the coaxial port of the BCI probe is connected to port 2. Rotary joint 280 is provided between bearing block 250 and the automatic vector network analyzer 290. This allows the balanced line to be rotated, so that a series of insertion loss measurements can be taken at regular intervals. In one experiment, measurements are taken at 15-degree intervals. Rotation may be controlled by a stepper motor, in one embodiment.

It is noted that a test setup in accordance with the present invention may be constructed somewhat differently than shown in FIG. 3. In one embodiment, the coaxial port of the balun on the right side of FIG. 3 may be connected to port 2 of the automatic vector network analyzer 290 instead of the matched load mentioned above. The coaxial port of the BCI probe may be connected to a load (not shown) to quantify the perturbation represented by the probe to the transmission line. In one embodiment, the coaxial port of the balun on the right side of FIG. 3 may be connected to a rotary coaxial joint (not shown). This would enable the port on the right side to be connected to a network analyzer and incremental measurements to be taken on the right side. In one embodiment, the cable shown in FIG. 3 may include more than two conductors. This would enable the test setup to more accurately characterize cable bundles used, for example, in automotive and avionic applications. One skilled in the art would understand how the balancing network could be modified to drive more than two conductors.

Figure 5:
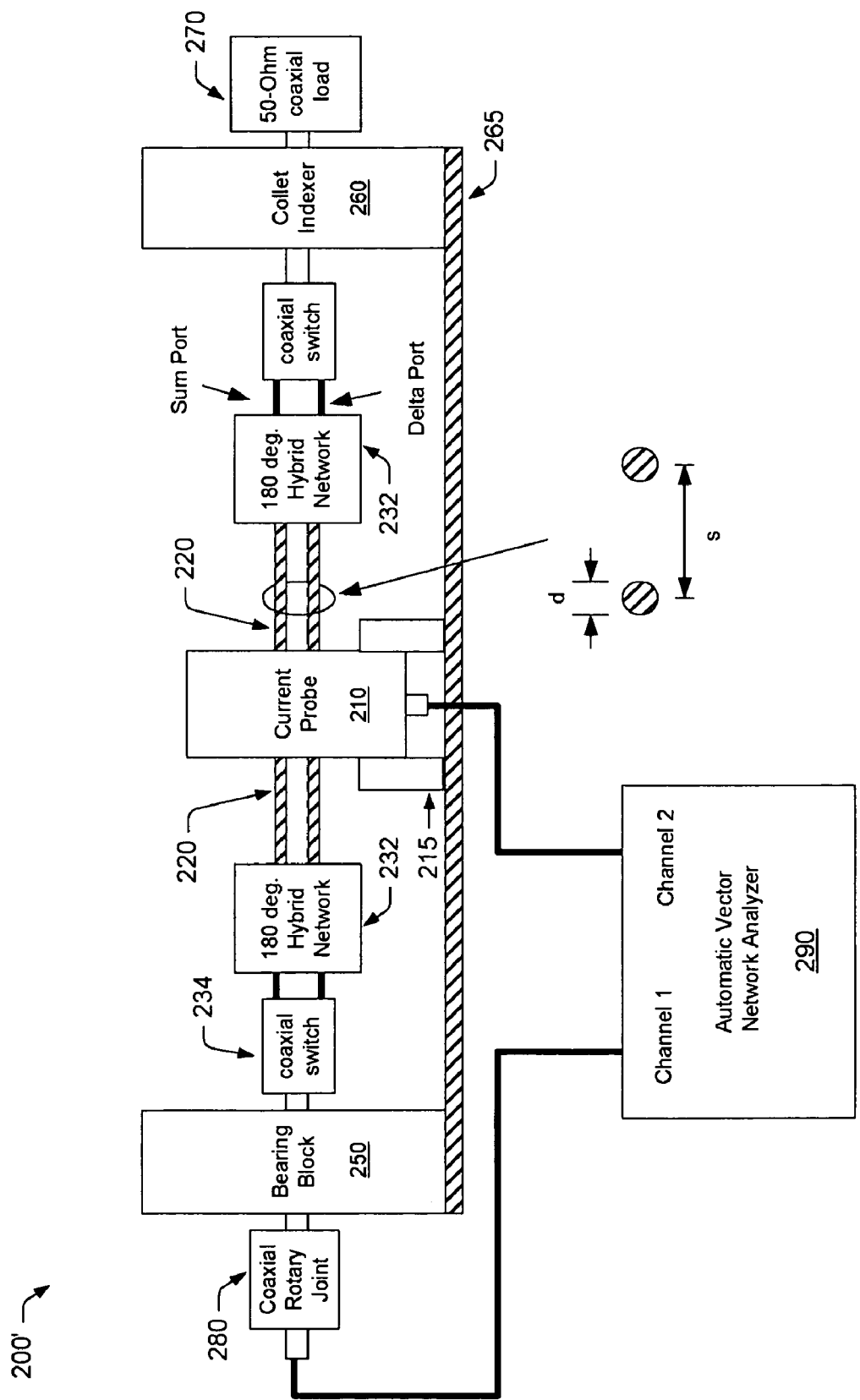
FIG. 5 is a block diagram illustrating another embodiment of a test setup that may be used to characterize the electromagnetic behavior of BCI transformers.

FIG. 5 illustrates yet another embodiment of a test setup in accordance with the present invention. The test setup shown in FIG. 5 is similar to the embodiment shown in FIG. 3. Components having similar reference numerals will not be described further herein for purposes of brevity. In general, the test setup shown in FIG. 5 differs from the previous embodiment by connecting both sides of the balanced transmission lines 220 to a 180° hybrid network 232 and coaxial switch 234. The hybrid networks and switches replace the voltage baluns used in FIG. 3. The use of hybrid networks combined with double-throw coaxial switches enables selective coupling to both the common mode and the differential mode. Common mode coupling is enabled by connecting the coaxial line at each end of the test setup to the sum port of the respective hybrid network via the corresponding coaxial switch 234. Differential mode coupling is enabled by connecting the coaxial line at each end of the test setup to the delta port of the respective hybrid network via the corresponding coaxial switch 234.

III. Measured Data

Before obtaining measurement data, a qualitative check of the common mode rejection (CMR) was undertaken by machining conducting clamps with which the two transmission line conductors 220 could be shorted together at either end of the test fixture. Although such a configuration would be a very minor perturbation to common mode energy, it should strongly discriminate against differential mode transmission. The presence of the clamps caused the insertion loss to drop well below −70 dB. As will become clear from the data presented in the next section, this insertion loss value is much greater than typical values for the measured data (with the shorting clamps absent), and thus, the data presented in the next section is not thought to be due to inadvertent excitation of the common mode.

Several different BCI probes were characterized using the test fixture shown in FIG. 3. Insertion loss data is presented in FIGS. 6A and 6B for one BCI probe, model F-120-4A provided by Fischer Custom Communications. As noted above, insertion loss data is measured between the output port of the BCI probe and the coaxial port of one of the baluns. In one experiment, insertion loss was measured with an Agilent 8720 automatic vector network analyzer. Although other probes were tested, the results were similar, and thus, not presented herein for purposes of brevity.

Figure 6A:
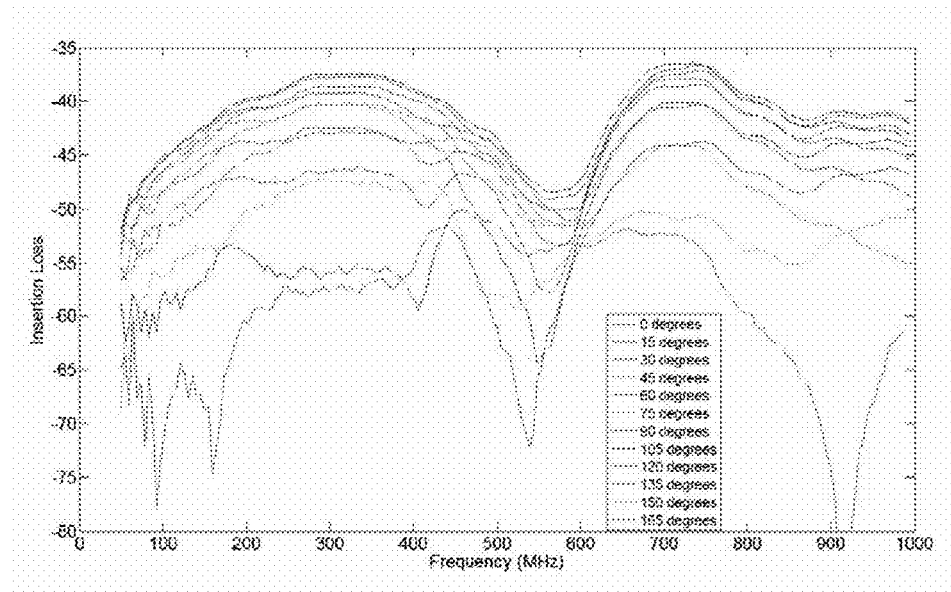
FIG. 6A is a graph in which insertion loss data, measured using the test setup of FIG. 3, is plotted for the BCI transformer of FIG. 1 as a function of frequency and angular orientation.
Figure 6B:
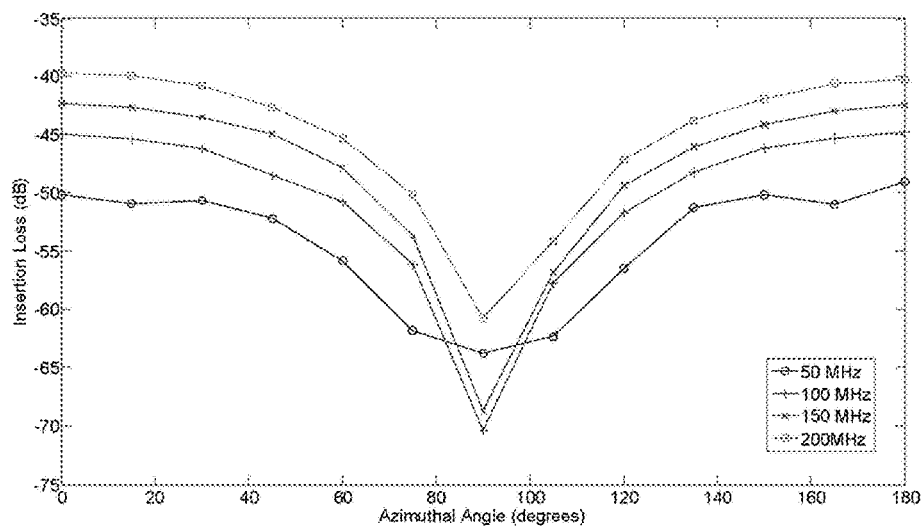
FIG. 6B is a graph which plots the insertion loss data, measured at 50, 100, 150, and 200 MHz using the test setup of FIG. 3, as a function of angle.

In FIG. 6A, the insertion loss data is plotted as a function of frequency with angular orientation increments of 15°. Zero degrees corresponds to the plane of the primary winding. In FIG. 6B, the insertion loss data at 50, 100, 150, and 200 MHz is plotted as a function of angle. From the data shown in FIGS. 6A and 6B, it is clear that maximum differential mode coupling occurs when the plane of the primary winding coincides with the plane of the transmission line conductors, and minimum coupling occurs in the orthogonal orientation. In other words, differential mode coupling is due to the magnetic field being strongest near the primary winding and weaker further away (see, FIG. 4).

Because differential mode coupling is generally quite small compared to that of the common mode (transmission loss for coupling to the common mode is about −10 dB), it is natural to wonder if the finite common-mode rejection ratio (CMRR) of the balun transformers is responsible for the finite insertion loss shown in FIGS. 6A and 6B. Speaking hypothetically, if the CMRR were 20 dB (constant with frequency) and the BCI probe exhibited no response to differential mode fields, one would expect the curves in FIG. 6A for differential mode excitation to be replicas of the curve for common mode excitation except shifted lower by 20 dB. However, this is not true—coupling to the common mode is relatively flat with frequency over the specified operating frequency range. It is also apparent that differential mode coupling from the balanced transmission line is dependent in a very repeatable manner on the orientation of the line with respect to the BCI probe. This should not be the case for common-mode currents. In other words, the performance of the BCI probe should not depend on its azimuthal orientation.

IV. Numerical Simulation

A numerical model employing a commercial finite element simulation was employed in an attempt to understand the behavior seen in the experiment presented above. A simplified first-order rational function dispersion model was adopted to represent the ferrite. This model has one advantage in that it satisfies the Kramers-Kronig relations, and thus, is self-consistent. A first-order rational function fit to the complex permeability with a single break frequency provides a reasonably good model for the dispersive nature of the ferrite. The numerical simulation indicates that the magnetic field in the cross section of the transformer is indeed non-uniform in the sense that it has azimuthal variation. The non-uniformity in the azimuth is accompanied by a vector field direction that is no longer purely azimuthal. However, the gross geometrical distribution of the magnetic field is such that it is strong in the half of the region near the primary winding and weak in the more distant half (see, FIG. 4). This variation in magnetic field is responsible for exciting the superposition of common and differential modes.

V. Experimental Conclusion

The test setup shown in FIG. 3 provides means for inducing and studying the coupling of a differential mode current (e.g., a balanced transmission line mode) to a commercially available BCI probe. The test setup shown in FIG. 5 provides means for inducing and studying common mode coupling and differential mode coupling. The measurements obtained with the test setup of FIG. 3 indicate that some commercially available probes can excite and receive differential mode energy at frequencies within the range of typical BCI tests. This behavior appears to be caused by distributed and dispersive effects within the ferrite cores of the probes. It is worthwhile to quantify this behavior, as differential modes may be similar to desired signals in an unshielded cable bundle and not interference from radiation. Finally, finite element simulations were conducted to verify and understand the behavior seen in the experiments. The simulations indicate, at least qualitatively, that magnetic loss in the ferrite is instrumental to the excitation of the differential modes, since magnetic loss is the cause of the azimuthal variation in the magnetic field.

Magnetic field uniformity degrades as the frequency is increased. Thus, the uniformity of the magnetic field limits the usable frequency response. In most cases, the size of the probe affects power handling with larger probes typically handling greater power levels. However, field uniformity also degrades with increasing probe size, so it could be said that uniformity also limits attainable power handling.

VI. Solution:

Various embodiments are provided in FIGS. 7-11 of a BCI transformer with improved magnetic field uniformity, bandwidth and power handling. Each embodiment includes a plurality of primary windings wrapped around a magnetic core. The magnetic core may have a cylindrical or toroidal shape, as discussed above. Each of the plurality of windings is implemented as a single turn or multiple, closely spaced turns occupying a small angular segment of the core. Regardless of the number of turns, the plurality of windings are spaced apart from one another and distributed around an azimuthal dimension of the magnetic core. A symmetric distribution of the windings is considered to provide optimum results. However, the BCI transformer described herein is not so limited and may generally include two or more windings, which are spaced apart from one another and distributed around the azimuthal dimension of the core.

The BCI transformers shown in FIGS. 7-11 are configured for operating in injection test mode. For instance, a power source and impedance transforming network are provided for supplying current to each of the windings at a respective feed point. The plurality of windings are driven in such a way that the resultant magnetic flux adds in phase using a zero- or 180-degree power divider (FIG. 8) or, in some cases, a series (FIGS. 9-10) or shunt (FIG. 11) connection. By driving the transformer at more than one feed point using appropriately phased signals, the magnetic flux generated in the core is much more uniform. This enables a "multiply-fed transformer" (i.e., a transformer having more than one feed) to more purely excite the desired common mode in the cable bundle.

Although the illustrated embodiments are configured for injection mode, one skilled in the art would readily understand how the illustrated embodiments could be modified to operate in sensing mode. For instance, a skilled artisan would understand that the power source and impedance transforming networks shown in FIGS. 8-11 may be removed and replaced with a current, voltage or power measuring device.

In other words, the BCI transformer acts as a passive current monitoring device when operating in sensing mode, and thus, does not require a power source and impedance transforming network. Once the BCI transformer is positioned around the electrical conductor(s) under test, existing current flowing through the conductors induces a magnetic field within the core, which causes current to flow through the plurality of windings. In some embodiments, common mode current flowing on the electrical conductors under test can be measured by sensing and combining the output signals received from each of the plurality of windings. The output signals may be selected from a group comprising current, voltage and power. The output signals may be sensed by any conventional means. Similar to injection mode, the arrangement of multiple feeds around the core enables the BCI transformer described herein to discriminate against the reception of undesirable non-common modes.

A BCI transformer in accordance with one embodiment of the present invention includes two or more primary windings, each wrapped around a longitudinal dimension of the magnetic core and symmetrically-spaced apart around an azimuthal dimension of the magnetic core. Two such arrangements employing single-turn windings are shown schematically in FIGS. 7A and 7B. Transformer 300 shown in FIG. 7A includes two single-turn windings 310/320 spaced approximately 180° apart around an azimuthal dimension of the core. In some cases, it might be necessary to employ more than two feed points. For example, three windings placed at 120° intervals would provide more uniform excitation than two and, of course, four windings placed at intervals of 90° would force an even more uniform flux. Transformer 400 having four single-turn windings 410, 420, 430, and 440 spaced approximately 90° apart is shown in FIG. 7B. Although single turn windings are illustrated herein, it is straightforward to see that such arrangements could employ multiple-turn windings with inter-winding capacitance being the only limiting factor in the number of turns.

Figure 7A:
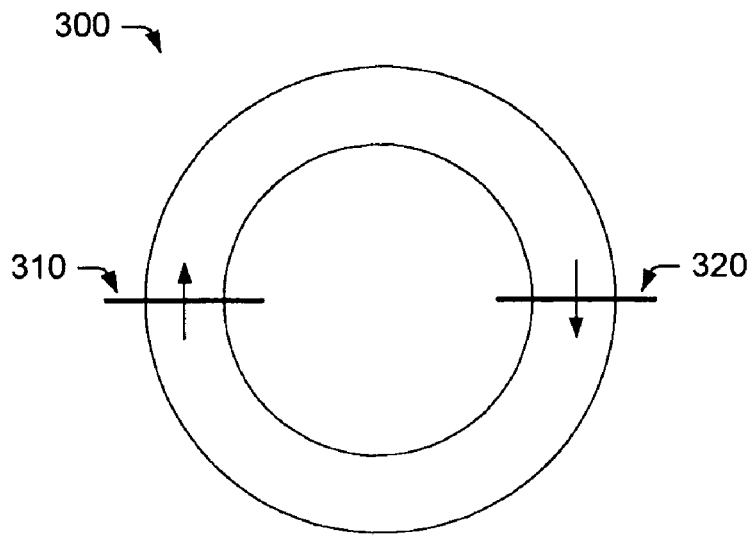
FIG. 7A is a cross-sectional view depicting an embodiment of an improved BCI transformer having two, single-turn primary windings symmetrically spaced about an azimuthal dimension of the transformer core.
Figure 7B:
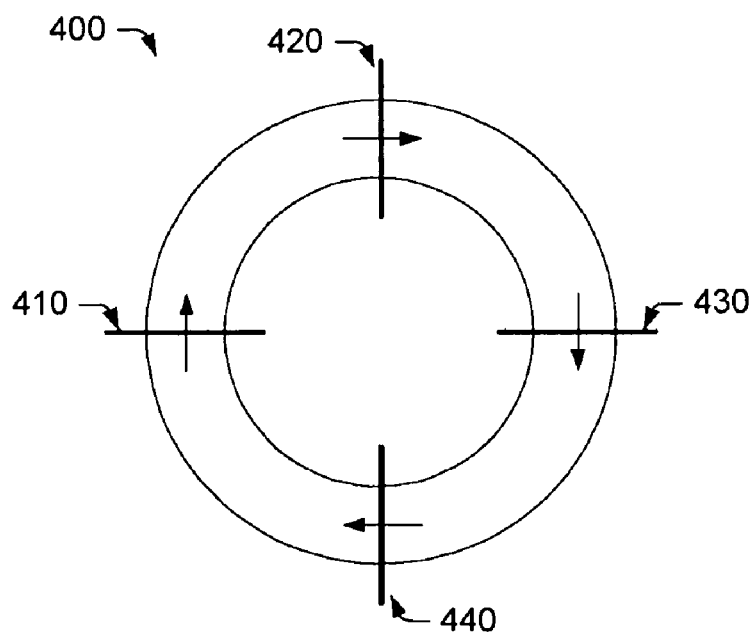
FIG. 7B is a cross-sectional view depicting an embodiment of an improved BCI transformer having four, single-turn primary windings symmetrically spaced about an azimuthal dimension of the transformer core.

As shown in FIGS. 7A and 7B, the magnetic fluxes due to each winding are oriented in the same direction. Such an arrangement dictates that current flow in the windings will also be in the same direction with respect to the azimuthal unit vector. In other words, the current sense of the two windings should be the same, and the windings should be series-aiding. In this situation, the windings can be driven by a single-ended source. However, it is worth noting that the input to the BCI probe is almost always a single-ended 50 Ohm coaxial connection. As such, balancing networks are often needed to implement this arrangement. Exemplary networks will be discussed in more detail below.

Although impedance matching could be used to improve the performance of any BCI transformer (including currently available units), a key feature of the invention is the substantially symmetric spacing of multiple windings on an electrically-large ferrite core in order to obtain a more uniform magnetic flux (i.e., a magnetic flux with reduced azimuthal variation). Azimuthal uniformity of the magnetic flux is central to the exclusive excitation and reception of the common mode. As shown above, many currently available BCI transformers excite/receive not only the common mode in cable bundles, but also non-common modes which adversely affect BCI tests. Such modes are avoided by providing the transformer with multiple windings and feed points, which are spaced symmetrically or somewhat symmetrically around the azimuthal dimension of the core.

It is recognized that impedance transforming techniques would improve the performance of the device and in this regard it is worthwhile to note that most power dividers and hybrids, especially those implemented using broadband approaches, have an even number of output ports. Thus, using an even number of windings might have an advantage. Particularly, the use of two or four windings is thought to be most useful, since a greater number of windings is often difficult to implement in practice and probably not necessary for performance. The use of two windings offers significant improvement over current designs without incurring undue complexity. Symmetrically spacing the windings provides optimum results. Thus, details for a design with two symmetrically-spaced feeds will be provided below. However, it should be understood that a transformer in accordance with the present invention may include two or more windings (each with one or more turns) without departing from the scope of the invention.

Figure 8:
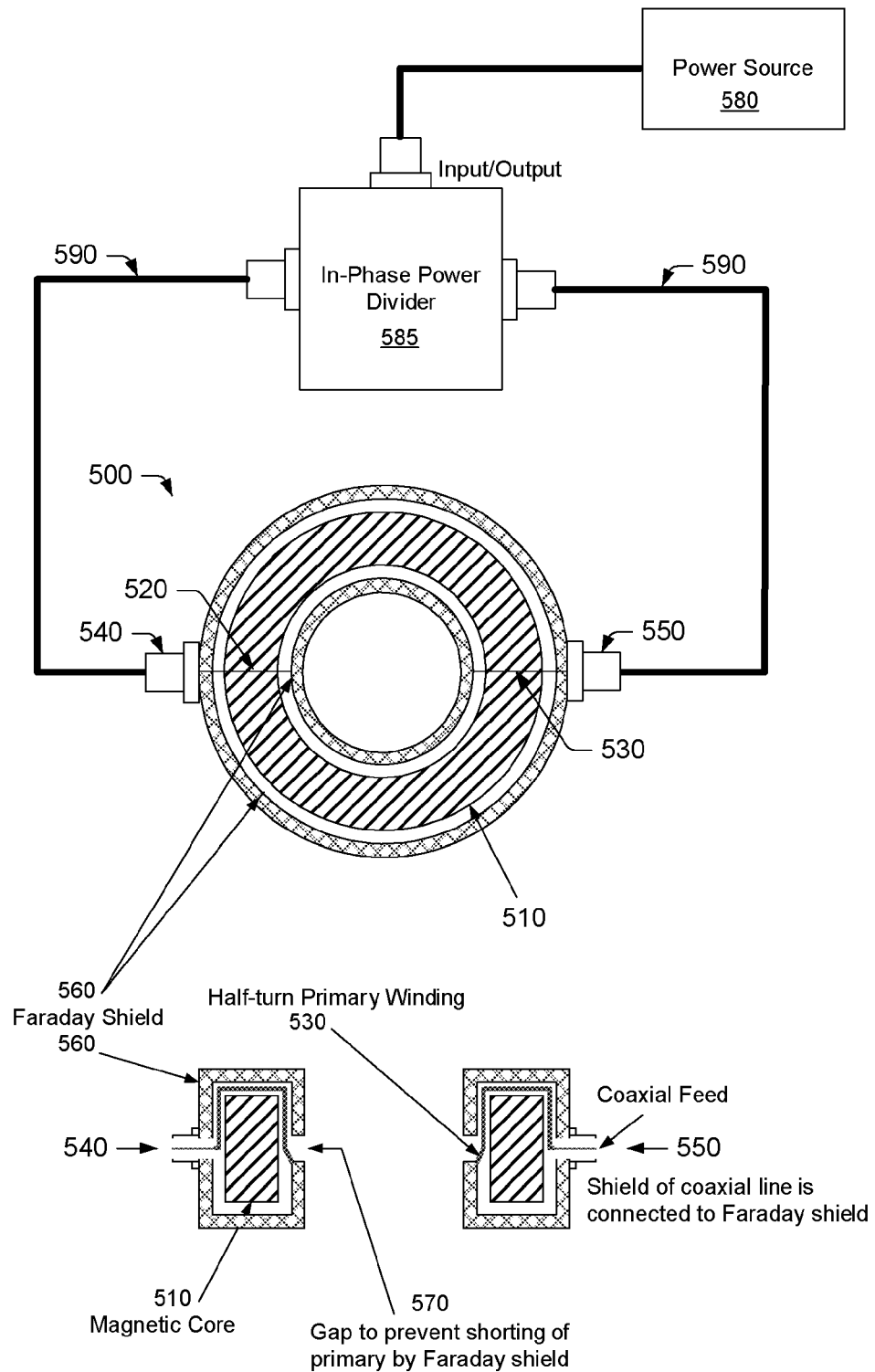
FIG. 8 is a cross-sectional view depicting an embodiment of an improved BCI transformer in which two symmetrically spaced windings are driven by an in-phase power divider.

One embodiment of a BCI probe with two symmetrically-spaced feeds is shown in FIG. 8. In particular, FIG. 8 is a cross-sectional view depicting BCI probe 500 having magnetic core 510 and a pair of primary windings 520/530. The magnetic core is composed of a ferrite material (e.g., Ni—Zn or Mn—Zn) and may have a cylindrical or toroidal shape, as discussed above. In some cases, the magnetic core may be a composite core comprising a "stack" of toroids, each having a nominally rectangular cross-section. However, the magnetic core is not limited to having a cylindrical or toroidal shape and may have substantially any geometry, which provides a closed magnetic circuit.

In the embodiment of FIG. 8, the primary windings are "wrapped" around a longitudinal dimension of the core and spaced 180° apart around an azimuthal dimension of the core. As used herein, a "longitudinal dimension" may be described as a dimensional plane perpendicular to the azimuthal unit vector (see, FIG. 2). Although the primary windings may be implemented as a single turn of copper strap, or several turns of magnet wire, a different approach is used in the illustrated embodiment. In this case, each of the windings 520/530 is implemented as a half-turn winding (typically, a half turn of copper strap). One end of the half turn is connected to the coaxial feed line of a coaxial input port 540 or 550, while the other end is connected to an electrostatic shield 560 (also called a Faraday shield) surrounding the core. Cross-sectional views of the electrostatic shield are shown in FIG. 8. Gaps 570 running through inner portions of the electrostatic shield prevent the primary windings from shorting to the shield. The coaxial feed line shield is connected to the electrostatic shield to provide a common ground.

As noted above, current flows through the primary windings in the same direction, enabling the probe to be driven with a single ended source. In some cases, a balancing network may be needed to match the source to the coaxial input ports of the probe. In FIG. 8, the probe inputs are driven in phase by RF power source 580 and a 0° or 180° power divider 585. Probe inputs 540/550 are connected to power divider 585 with two, equal-length coaxial lines 590. The power source is connected to the power divider at the input/output port.

The BCI probe design shown in FIG. 8 provides greatly improved magnetic field uniformity, as well as improved bandwidth and power handling, by spacing multiple feeds around an azimuthal dimension of the core. Although the probe provides a robust design, the inventive concepts described herein are not limited to the particular embodiment shown in FIG. 8. Alternative embodiments (see, e.g., FIGS. 9-11) may implement the balancing network somewhat differently than shown in FIG. 8. Other embodiments (not shown herein) may provide a probe design, which does not include or rely upon an electrostatic shield. The description set forth herein is intended to encompass all such embodiments and variations.

Figure 9:
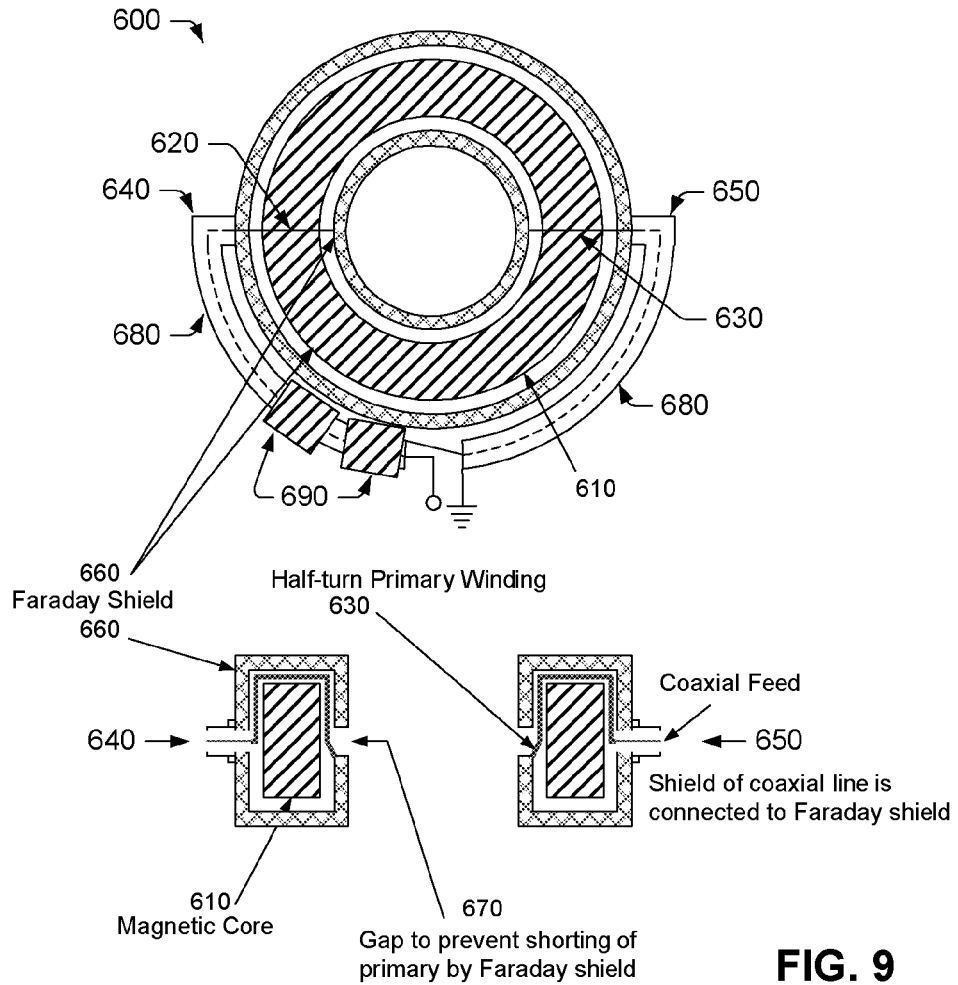
FIG. 9 is a cross-sectional view depicting an embodiment of an improved BCI transformer in which two symmetrically spaced windings are driven by a series connection.
Figure 10:
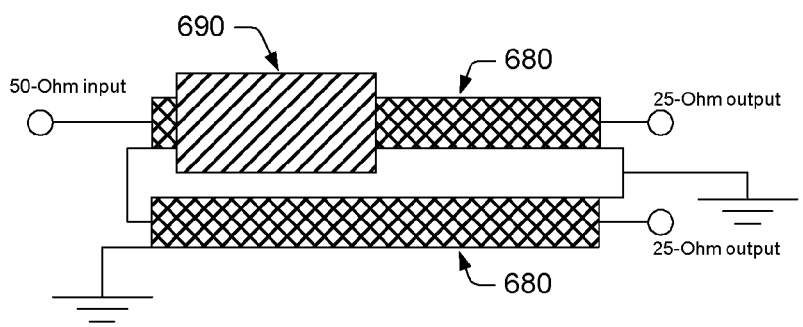
FIG. 10 is a schematic depicting one manner in which the series connection shown in FIG. 9 may be implemented.

FIGS. 9-10 illustrate one embodiment of an alternative probe design. In particular, FIGS. 9-10 depict BCI probe 600 having two symmetrically spaced feeds and a series-series balun arrangement. The embodiment shown in FIGS. 9-10 is similar to the previous embodiment, in that BCI probe 600 includes magnetic core 610, and a pair of primary windings 620/630 symmetrically spaced around an azimuthal dimension of the core. The magnetic core may be implemented as discussed above.

In the embodiment of FIGS. 9-10, the primary windings are "wrapped" around a longitudinal dimension of the core and spaced 180° apart around an azimuthal dimension of the core. As in the previous embodiment, each of the windings 620/630 is implemented as a half-turn (typically, a half turn of copper strap). One end of the half turn is connected to the coaxial feed line of a coaxial input port 640 or 650, while the other end is connected to electrostatic shield 660 surrounding the core. Gaps 670 running through inner portions of the electrostatic shield prevent the primary windings from shorting to the shield. The coaxial feed line shield is connected to the electrostatic shield to provide a common ground.

Unlike the previous embodiment, the input ports of probe 600 are driven in phase with a series-series balun arrangement. The balun can be designed so as to provide a relatively good match to a 50-Ohm source. For example, a single feed design having one single-turn primary winding provides a reasonably good match to a 50-Ohm source. If the single feed design were modified to use two symmetrically-spaced feeds, the feed point impedance might be expected to be approximately half that of a single feed probe. Thus, if a single feed probe is well matched to 50 Ohms, a series connection using two, 25-Ohm interconnection transmission lines and a "series" input connection would be nearly optimum. In theory, the task of driving the two feeds amounts to implementing a transformer with two in-phase 25-Ohm outputs. However, given the very broad operating frequency range of such devices, a practical feed network is somewhat more complicated than first appears.

The shielded nature of the probe causes some further complication in the implementation of multiple feeds. In the absence of the electrostatic shield, all that would be required to reverse the sense of a winding would be to reverse the direction in which it is wound. However, in the embodiments set forth herein, the primary winding is implemented as a half-turn coil, which is connected to the electrostatic shield at what would be the midpoint of an entire turn.

If one were to employ two 25-Ohm feeds and a series connection at the input, it would be necessary to "choke" one of the feeds in order to implement the desired series connection. That is, the existence of the electrostatic shield combined with the current sense necessary to produce additive flux requires a choke type connection at the series input. One embodiment of a choke-type transformer is shown in FIGS. 9-10.

The coaxial line used to implement the choke transformer must have a 25-Ohm characteristic impedance if the probe is to have sufficiently broad bandwidth. 25-Ohm coaxial cable is commercially available. However, it might be more practical, in some cases, to use either two 50-Ohm cables 680 connected in parallel at both ends (as shown in FIG. 10) or to implement 25-Ohm strip line conforming to the case of the transformer (not shown). Such strip line would be straightforward to implement using a flexible, low-loss polymer substrate, such as a fluoropolymer (PTFE) or a polyimide (Kapton).

In FIGS. 9-10, the series connection is implemented by placing one or more ferrite choke beads 690 on one of the 50-Ohm cables 680. It is possible to use choke beads on both cables to provide more symmetry to the system, but if the shielding action of the cable is perfect, it will make no difference in the electrical performance.

Figure 11:
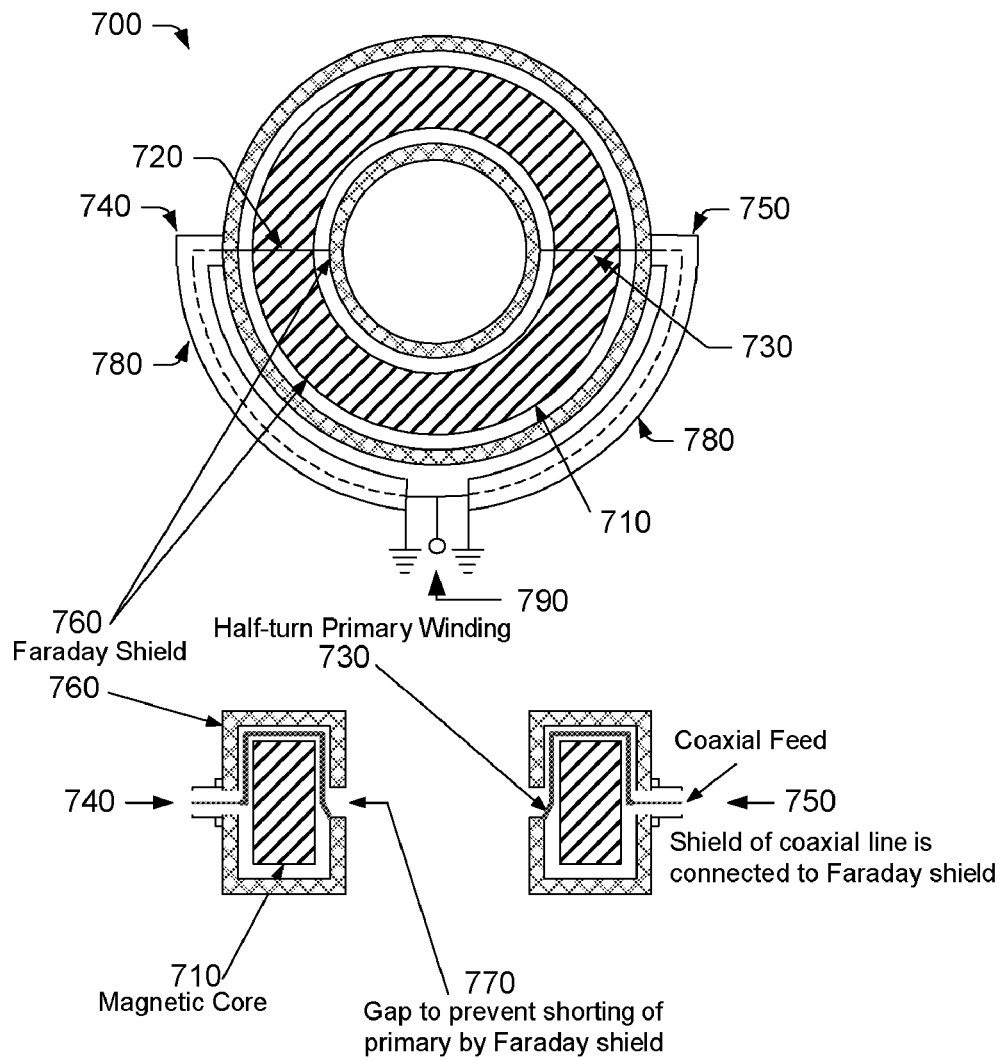
FIG. 11 is a cross-sectional view depicting an embodiment of an improved BCI transformer in which two symmetrically spaced windings are driven by a parallel connection.

FIG. 11 illustrates another embodiment of an alternative probe design. In particular, FIG. 11 depicts BCI probe 700 having two symmetrically-spaced feeds connected in parallel. The embodiment shown in FIG. 11 is similar to the previous embodiments, in that BCI probe 700 includes magnetic core 710, and a pair of primary windings 720/730 symmetrically-spaced around an azimuthal dimension of the core. The magnetic core may be implemented as discussed above.

In the embodiment of FIG. 11, the primary windings are "wrapped" around a longitudinal dimension of the core and spaced 180° apart around an azimuthal dimension of the core. As in the previous embodiments, each of the windings 720/730 is implemented as a half-turn (typically, a half turn of copper strap). One end of the half turn is connected to the coaxial feed line of a coaxial input port 740 or 750, while the other end is connected to electrostatic shield 760 surrounding the core. Gaps 770 running through inner portions of the electrostatic shield prevent the primary windings from shorting to the shield. The coaxial feed line shield is connected to the electrostatic shield to provide a common ground.

Unlike the previous embodiment, the input ports 740/750 of probe 700 are driven in phase with a parallel connection. The parallel connection can be designed so as to provide a relatively good match to a 50-Ohm source. In one embodiment, two 100 Ohm coaxial cables 780 may be coupled to the input ports of the probe. The shields and center conductors of the 100 Ohm cables 780 may be connected in parallel at a 50 Ohm single-ended coaxial port 790. Although not shown in FIG. 11, single-ended port 790 may be driven, in some embodiments, by a 50 Ohm single-ended source.

One feature common to commercially available BCI probes is the split nature of the core and electrostatic shield. The two "halves" of the core and shield are coupled with a precision hinge to allow the transformer to be "open" in order to clamp around a cable bundle. Some embodiments of the invention may be configured to accommodate a split transformer design. It is recognized that using two or more primary windings means that one or more of the windings will be located in opposite halves of the split transformer. This makes the feed transmission line network slightly more complicated, but the use of flexible transmission line media enables the opening action to be accommodated. In fact, the use of low characteristic impedance transmission lines facilitates the use of flexible transmission lines as the larger conductors make the line less fragile. One very effective way of implementing low frequency flexible transmission lines would be to use Kapton flexible circuit board. However, traditional coaxial cable with a braided shield would also be adequate.

It will be appreciated to those skilled in the art having the benefit of this disclosure that this invention is believed to provide a BCI transformer with improved magnetic field uniformity, bandwidth and power handling. More specifically, the invention provides a BCI transformer having multiple primary windings/feeds spaced apart around an azimuthal dimension of the transformer core. By driving the transformer at more than one feed point using appropriately phased signals, the magnetic flux in the core is much more uniform. This enables the multiply-fed transformer described herein to excite only common modes in the cable bundle and discriminate against non-common modes.

The invention described herein is also believed to provide an improved BCI test method. For instance, the BCI transformer described above may be used to perform an injection mode test or a sensing mode test.

During injection mode tests, equal amounts of power may be supplied to each of the plurality of windings (at the feed points) to generate an electromagnetic field within the magnetic core. In some embodiments, equal amounts of power may be supplied to each of the plurality of windings by coupling an impedance balancing network between a power source and each of the plurality of windings. The impedance balancing network may be selected from a group comprising an in-phase power divider, a series-series balun arrangement and a parallel connection arrangement, as described above. By supplying power to multiple windings/feed points, an azimuthally-uniform magnetic field is generated in the core for inducing only common mode current within the electrical conductors under test.

During sensing mode tests, common mode current flowing on the electrical conductors under test may be measured by sensing and combining output signals received from each of the plurality of windings (at the feed points). The output signals are selected from a group comprising current, voltage and power. The output signals may be sensed by any conventional means. Similar to injection mode, the arrangement of multiple feeds around the core enables the BCI transformer described herein to discriminate against the reception of undesirable non-common modes.

The invention described herein is further believed to provide an improved test setup for characterizing a BCI transformer. Unlike conventional calibration fixtures, the test setup described herein comprises two or more electrical conductors arranged in parallel and separated by a distance. A dielectric clamp is coupled to an external surface of the BCI transformer to position the BCI transformer around the electrical conductors, such that the plurality of electrical conductors extend through the BCI transformer along a longitudinal axis. Means are included for altering and fixing the distance between the electrical conductors, so as to accommodate non-common modes therein. An automatic vector analyzer network is coupled between an output port of the BCI transformer under test and an output port of the test setup for characterizing the common and non-common modes produced by the BCI transformer.

Further modifications and alternative embodiments of various aspects of the invention will be apparent to those skilled in the art in view of this description. It is intended, therefore, that the following claims be interpreted to embrace all such modifications and changes and, accordingly, the specification and drawings are to be regarded in an illustrative rather than a restrictive sense.

What is claimed is:

1. A Bulk Current Injection (BCI) transformer operable in injection and current sensing modes, the BCI transformer comprising:
   a magnetic core encircling one or more electrical conductors under test; and
   a plurality of separate windings each wrapped, at least in part, around a longitudinal dimension of the magnetic core, wherein each of the plurality of separate windings comprises a respective feed point of the BCI transformer, and wherein the plurality of separate windings and respective feed points are symmetrically spaced apart around an azimuthal dimension of the magnetic core.

2. The BCI transformer recited in claim 1, wherein the magnetic core comprises a ferrite material.

3. The BCI transformer recited in claim 1, wherein the magnetic core comprises a geometrical shape configured to provide a closed magnetic circuit.

4. The BCI transformer recited in claim 1, wherein the plurality of windings comprise two windings spaced approximately 180° apart around the azimuthal dimension of the magnetic core.

5. The BCI transformer recited in claim 1, wherein the plurality of windings each comprise one or more turns of an electrical conductor.

6. The BCI transformer recited in claim 1, further comprising an electrostatic shield encasing the magnetic core and the plurality of windings.

7. The BCI transformer recited in claim 6, wherein each of the plurality of windings comprises a half-turn of an electrical conductor, wherein one end of each half-turn is connected to the electrostatic shield, and wherein another end of each half-turn is connected to a feed line connecting the transformer to a power source.

8. The BCI transformer recited in claim 1, further comprising a power source coupled for supplying current to each of the plurality of separate windings at the respective feed points during the injection mode, wherein current flow through the windings induces an azimuthally uniform magnetic flux density in the magnetic core, which in turn excites only common mode currents in the electrical conductors under test.

9. The BCI transformer recited in claim 8, further comprising an impedance transforming network coupled between the power source and each feed point of the plurality of separate windings.

10. The BCI transformer recited in claim 9, wherein the impedance transforming network comprises an in-phase power divider.

11. The BCI transformer recited in claim 9, wherein the impedance transforming network comprises a series-series balun arrangement.

12. The BCI transformer recited in claim 9, wherein the impedance transforming network comprises a parallel connection between the plurality of windings.

13. The BCI transformer recited in claim 1, further comprising a device for measuring common mode current flowing on the electrical conductors under test during the sensing mode, where the device measures the common mode current by sensing and combining output signals received from each of the plurality of separate windings at the respective feed points.

14. The BCI transformer recited in claim 13, wherein the output signals are selected from a group comprising current, voltage and power.

15. A Bulk Current Injection (BCI) test method, comprising:
arranging a BCI transformer around one or more electrical conductors under test, wherein the BCI transformer comprises:
a magnetic core encircling the electrical conductors under test; and
a plurality of separate windings each wrapped, at least in part, around a longitudinal dimension of the magnetic core, wherein each of the plurality of separate windings comprises a respective feed point of the BCI transformer, and wherein the plurality of separate windings and respective feed points are symmetrically spaced apart around an azimuthal dimension of the magnetic core.

16. The BCI test method as recited in claim 15, further comprising supplying equal amounts of power to each of the plurality of separate windings at the respective feed points to generate an electromagnetic field within the magnetic core which induces common mode current flow within the electrical conductors under test.

17. The BCI test method as recited in claim 16, wherein the step of supplying equal amounts of power to each of the plurality of separate windings is performed by coupling an impedance balancing network between a power source and each feed point of the plurality of windings.

18. The BCI test method as recited in claim 17, wherein the impedance balancing network is selected from a group comprising a'n in-phase power divider, a series-series balun arrangement and a parallel connection arrangement.

19. The BCI test method as recited in claim 15, further comprising measuring common mode current flowing on the electrical conductors under test by sensing and combining output signals received from each of the plurality of separate windings at the respective feed points.

20. The BCI test method as recited in claim 19, wherein the output signals are selected from a group comprising current, voltage and power.

21. A test setup for characterizing a Bulk Current Injection (BCI) transformer, the test setup comprising:
a plurality of electrical conductors arranged in parallel and separated by a distance, which is chosen so that azimuthally-inhomogeneous magnetic fields from the BCI transformer excite non-common modes in the plurality of electrical conductors; and
a dielectric clamp coupled to an external surface of the BCI transformer to position the BCI transformer around the electrical conductors, such that the plurality of electrical conductors extend through the BCI transformer along a longitudinal axis.

22. The test setup as recited in claim 21, wherein the plurality of electrical conductors comprises two or more electrical conductors of uniform cross-sectional geometry.

23. The test setup as recited in claim 21, further comprising a pair of voltage baluns, each coupled to a different end of the plurality of electrical conductors.

24. The test setup as recited in claim 23, further comprising an automatic vector network analyzer coupled for characterizing the non-common modes excited by the BCI transformer, wherein said characterization is performed by measuring insertion loss.

25. The test setup as recited in claim 24, wherein a first port of the automatic vector network analyzer is coupled to an output port of the BCI transformer and a second port of the automatic vector network analyzer is coupled to an output port of one of the voltage baluns for measuring insertion loss there between.

26. The test setup as recited in claim 25, further comprising rotational means coupled between the output port of the one voltage balun and the second port of the automatic vector network analyzer for rotating the electrical conductors in incremental stages so that incremental insertion loss measurements can be obtained.

27. The test setup as recited in claim 21, further comprising a pair of 180-degree hybrid networks each coupled to a different end of the plurality of electrical conductors, and a pair of coaxial switches each coupled to a pair of sum and difference ports of a respective hybrid network, wherein activation of the coaxial switches causes the hybrid networks to receive a common mode signal or a non-common mode signal.

28. The test setup as recited in claim 27, further comprising an automatic vector network analyzer coupled for characterizing the common mode and non-common modes excited by the BCI transformer, wherein said characterization is performed by measuring insertion loss.

29. The test setup as recited in claim 28, wherein a first port of the automatic vector network analyzer is coupled to an output port of the BCI transformer and a second port of the automatic vector network analyzer is coupled to an output port of one of the coaxial switches for measuring insertion loss there between.

30. The test setup as recited in claim 29, further comprising rotational means coupled between the output port of the one coaxial switch and the second port of the automatic vector network analyzer for rotating the electrical conductors in incremental stages so that incremental insertion loss measurements can be obtained.

* * * * *

UNITED STATES PATENT AND TRADEMARK OFFICE
CERTIFICATE OF CORRECTION

| | | |
|---|---|---|
| PATENT NO. | : 8,159,240 B2 | |
| APPLICATION NO. | : 12/351044 | |
| DATED | : April 17, 2012 | |
| INVENTOR(S) | : McLean et al. | |

It is certified that error appears in the above-identified patent and that said Letters Patent is hereby corrected as shown below:

IN THE CLAIMS:

Claim 18, col. 17, line 63, please delete "a'n" and substitute --an--.

Signed and Sealed this
Thirty-first Day of July, 2012

David J. Kappos
*Director of the United States Patent and Trademark Office*